United States Patent
Fruhauf et al.

(10) Patent No.: US 7,372,304 B2
(45) Date of Patent: May 13, 2008

(54) SYSTEM AND METHOD FOR GLITCH DETECTION IN A SECURE MICROCONTROLLER

(75) Inventors: Serge F. Fruhauf, Cupertino, CA (US); Alain C. Pomet, Rousset (FR)

(73) Assignees: STMicroelectronics, Inc., Carrollton, TX (US); STMicroelectronics S.A. (FR)

( * ) Notice: Subject to any disclaimer, the term of this patent is extended or adjusted under 35 U.S.C. 154(b) by 109 days.

(21) Appl. No.: 11/243,328

(22) Filed: Oct. 4, 2005

(65) Prior Publication Data

US 2007/0075746 A1    Apr. 5, 2007

(51) Int. Cl.
    *H03K 19/00* (2006.01)
(52) U.S. Cl. .................. 326/93; 326/38; 326/46; 326/8
(58) Field of Classification Search ............ 326/8, 326/37, 38, 41, 46, 93–98; 714/48
    See application file for complete search history.

(56) References Cited

U.S. PATENT DOCUMENTS

| | | | |
|---|---|---|---|
| 5,732,249 A | | 3/1998 | Masuda et al. |
| 6,016,066 A | * | 1/2000 | Ilkbahar ............... 327/23 |
| 6,925,590 B2 | * | 8/2005 | Campbell .............. 714/726 |
| 6,981,204 B2 | * | 12/2005 | Sakai et al. ............. 714/797 |
| 2002/0060595 A1 | | 5/2002 | Nakano |
| 2003/0052708 A1 | * | 3/2003 | Momtaz et al. ........... 326/37 |
| 2003/0214772 A1 | | 11/2003 | Hugues et al. |
| 2004/0015774 A1 | * | 1/2004 | Sakai et al. ............. 714/797 |
| 2004/0044922 A1 | | 3/2004 | Wu |
| 2005/0022075 A1 | * | 1/2005 | Rodriguez ............. 714/57 |
| 2006/0271793 A1 | * | 11/2006 | Devadas et al. ......... 713/189 |

FOREIGN PATENT DOCUMENTS

JP    2002-100980    5/2002

OTHER PUBLICATIONS

European Search Report issued on Oct. 4, 2007 in European Patent Application No. 06 25 5109.

* cited by examiner

Primary Examiner—Don P. Le
(74) Attorney, Agent, or Firm—Lisa K. Jorgenson; William A. Munck

(57) ABSTRACT

An apparatus includes a plurality of macrocells formed from logic capable of performing one or more functions. The apparatus also includes a clock tree capable of receiving a clock signal and providing at least one copy of the clock signal to each macrocell. The clock tree includes a local branch within each macrocell, where each local branch is capable of providing at least one copy of the clock signal. In addition, the apparatus includes at least one glitch detection circuit capable of detecting a glitch in one or more copies of the clock signal provided by the local branches in the macrocells.

20 Claims, 4 Drawing Sheets

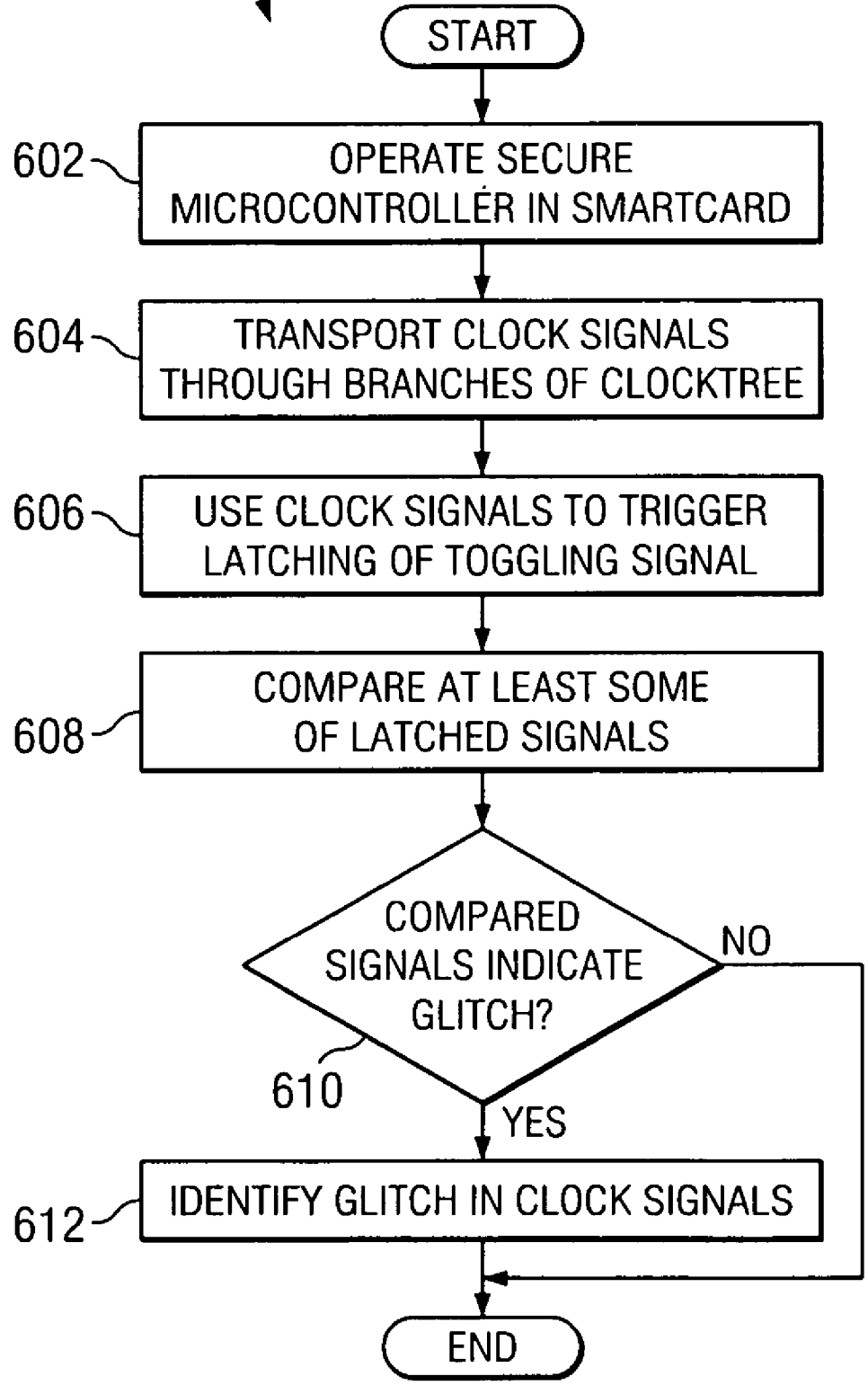

SYSTEM AND METHOD FOR GLITCH DETECTION IN A SECURE MICROCONTROLLER

TECHNICAL FIELD

This disclosure is generally directed to secure devices and more specifically to a system and method for glitch detection in a secure microcontroller.

BACKGROUND

Smartcards and other secure devices are routinely used to identify personnel or provide other security features. For example, smartcards are often used to identify particular computer users, where authorized users may use a computing device or access a computing system after identification. As another example, smartcards are often used in television distribution systems, such as in cable and satellite television receivers, to control which customers receive service.

Hackers and other people routinely attempt to illicitly access secure information stored on smartcards or other secure devices. For example, fault injection is often used during attempts to identify cryptographic keys stored on smartcards. One specific type of fault injection involves manipulating clock signals in the smartcards to create glitches in the clock signals. These glitches may then lead to errors in the processes and tasks performed by the smartcards. Conventional smartcards and other secure devices often use internal clock generators with filters to filter glitches from the clock signals. However, some fault injection techniques still allow glitches to be created in clock signals, such as glitches created in clock signals transported by internal clock trees. As a result, conventional smartcards and other secure devices are still vulnerable to fault injection.

SUMMARY

This disclosure provides a system and method for glitch detection in a secure microcontroller.

In a first embodiment, an apparatus includes a plurality of macrocells formed from logic capable of performing one or more functions. The apparatus also includes a clock tree capable of receiving a clock signal and providing at least one copy of the clock signal to each macrocell. The clock tree includes a local branch within each macrocell, where each local branch is capable of providing at least one copy of the clock signal. In addition, the apparatus includes at least one glitch detection circuit capable of detecting a glitch in one or more copies of the clock signal provided by the local branches in the macrocells.

In a second embodiment, a secure device includes a memory capable of storing information and a secure microcontroller capable of securing the information in the memory. The secure microcontroller includes a plurality of macrocells formed from logic capable of performing one or more functions. The secure microcontroller also includes a clock tree capable of receiving a clock signal and providing at least one copy of the clock signal to each macrocell. The clock tree includes a local branch within each macrocell, and each local branch is capable of providing at least one copy of the clock signal. In addition, the secure microcontroller includes at least one glitch detection circuit capable of detecting a glitch in one or more copies of the clock signal provided by the local branches in the macrocells.

In a third embodiment, a method includes operating, in a secure device, a plurality of macrocells. The macrocells include logic capable of performing one or more functions, and each macrocell receives at least one copy of a clock signal from a local branch of a clock tree. The method also includes, during operation of the macrocells, detecting a glitch in one or more copies of the clock signal provided by the local branches in the macrocells.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which:

FIG. 6 illustrates an example method for glitch detection in a secure microcontroller according to one embodiment of this disclosure.

DETAILED DESCRIPTION

Figure 1:
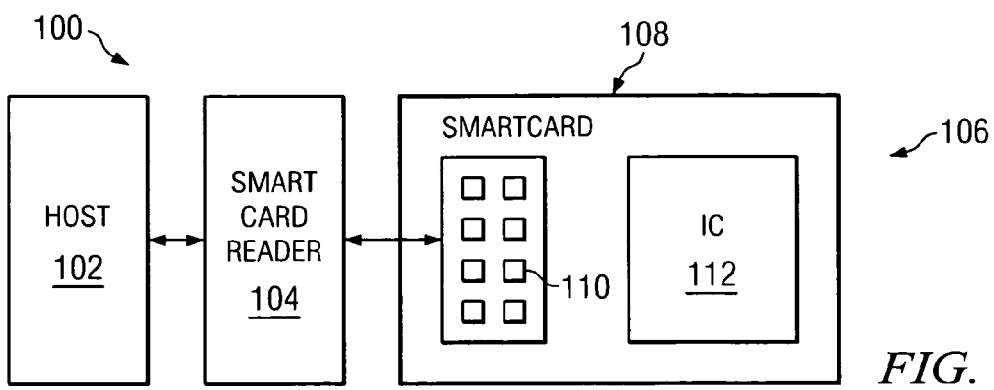
FIG. 1 illustrates an example system with a secure device according to one embodiment of this disclosure.

FIG. 1 illustrates an example system 100 with a secure device according to one embodiment of this disclosure. In this example, the system 100 includes a host 102, a smartcard reader 104, and a smartcard 106. This embodiment of the system 100 is for illustration only. Other embodiments of the system may be used without departing from the scope of this disclosure.

The host 102 is coupled to or otherwise interacts with the smartcard reader 104. The host 102 includes any suitable device or system capable of interfacing with the smartcard 106 and using information stored on the smartcard 106 to perform one or more functions. For example, the host 102 could represent a computing device, such as a desktop computer, laptop computer, or handheld computer. In this example, the computing device could use the information stored on the smartcard 106 to identify a user and control user access to the computing device, a computing system, or a portion thereof. As another example, the host 102 could represent a cable or satellite television receiver that uses the information on the smartcard 106 to determine whether a customer is allowed to receive particular television services. As yet another example, the host 102 could represent an automated teller machine (ATM) or other banking machine or a point-of-sale (POS) device such as a cash register. In this example, the ATM, banking machine, or POS device could use the information on the smartcard 106 to provide access to a bank or other account, to debit a bank or other account, or to charge an expense to a bank or other account. The host 102 could represent any other or additional type of device or system.

The smartcard reader 104 is coupled to or otherwise interacts with the host 102. The smartcard reader 104 is also capable of receiving or otherwise interfacing with the smartcard 106. The smartcard reader 104 interacts with the smartcard 106 to send information to or receive information from the smartcard 106. For example, the smartcard reader 104 could allow the host 102 to communicate information to the smartcard 106. The smartcard reader 104 could also allow the smartcard 106 to provide information to the host 102. This may allow, for example, the host 102 and the smartcard 106 to interact so that the host 102 can retrieve the secure information from the smartcard 106. This may also allow the host 102 to authenticate the smartcard 106 or the information contained on the smartcard 106. The smartcard reader 104 represents any suitable structure or device for facilitating communication between the host 102 and the smartcard 106.

The smartcard reader 104 could support one or multiple protocols or standards for communicating with the smartcard 106. For example, the smartcard reader 104 could represent an International Organization for Standardization (ISO) 7816 smartcard reader, a Universal Serial Bus (USB) smartcard reader, or any other or additional type of smartcard reader. Also, a single smartcard reader 104 could be capable of using multiple protocols or standards to communicate with multiple types of smartcards 106.

The host 102 and the smartcard reader 104 may also communicate in any suitable manner. For example, the host 102 and the smartcard reader 104 could communicate over a serial interface, a USB bus, a wireless interface, or any other suitable interface. Also, the host 102 and the smartcard reader 104 could be configured to communicate over multiple interfaces, such as both a serial interface and a USB bus.

The smartcard 106 is capable of interfacing with the smartcard reader 104 for interaction with the host 102. The smartcard 106 represents a secure device capable of storing and securing information. For example, the smartcard 106 could store information identifying a computer user, information used to receive cable or satellite television services, or monetary, banking, or account information. The smartcard 106 could also store security keys or other information used to secure the smartcard 106. The smartcard 106 could store any other or additional information for any other or additional use or purpose.

In this example, the smartcard 106 includes a carrier 108, a set of contacts 110, and an integrated circuit (IC) 112. The carrier 108 is capable of carrying or supporting the other components of the smartcard 106. For example, the carrier 108 could represent a plastic card or other structure for carrying the contacts 110 and the integrated circuit 112. The carrier 108 could have any suitable size or shape, such as a rectangular shape that is thin and small enough to fit inside a wallet like a credit card. Also, the carrier 108 could be formed from any suitable material or materials, such as plastic.

The contacts 110 provide an electrical connection between the smartcard reader 104 and the integrated circuit 112. For example, two contacts 110 could represent connections for receiving operating power (Vcc) and an electrical ground (GND). Two other contacts 110 could represent connections for receiving a reset signal (RST) and an external clock signal (CLK). One contact 110 could represent a connection for receiving programming power (Vpp), which is used to reprogram an electrically erasable programmable read only memory or other memory in the smartcard 106. One contact 110 could represent a connection for a serial interface (I/O) with the smartcard reader 104, while two other contacts 110 could represent connections for a USB interface (D+ and D−) with the smartcard reader 104. This represents one specific example of the contacts 110 that could be used in the smartcard 106. The smartcard 106 could include any other or additional contact(s) according to particular needs. Also, if the smartcard 106 communicates wirelessly with the smartcard reader 104, the contacts 110 could be replaced by or the smartcard 106 may further include an antenna. The contacts 110 represent any suitable structures for providing electrical connection to an integrated circuit.

The integrated circuit 112 is coupled to the contacts 110. The integrated circuit 112 is also encased, recessed in, or otherwise carried by the carrier 108 of the smartcard 106. The integrated circuit 112 performs various functions of the smartcard 106. For example, the integrated circuit 112 could securely store information on the smartcard 106. The integrated circuit 112 could also interact with the host 102 to validate the host 102, to validate the smartcard 106 with the host 102, to provide the secure information to the host 102, or to use the secure information in some way for the host 102. The integrated circuit 112 includes any suitable circuitry or other logic for securing information. One example embodiment of the integrated circuit 112 is shown in FIG. 2, which is described below.

In one aspect of operation, the integrated circuit 112 includes a clock tree or other structure for distributing clock signals to other components of the integrated circuit 112. Conventional smartcards are vulnerable to fault injection or other attacks that introduce glitches into the clock signals transported by the clock tree. A "glitch" is generally any unexpected irregularity or abnormality in a signal. To help provide greater security for the smartcard 106, the clock signals transported by different branches of the clock tree (referred to as "local branches") are examined or monitored. For example, the clock signals in the local branches may be used to clock registers or other logic. A glitch in one or more local branches may not propagate to all other local branches being monitored in the clock tree. As a result, the outputs of the registers or other logic could be compared to determine if one or more of the clock signals contains a glitch, which could be indicative of a fault injection or other attack. If a glitch is detected, any suitable actions may be performed, such as logging the event or resetting the integrated circuit 112.

Although FIG. 1 illustrates one example of a system 100 with a secure device, various changes may be made to FIG. 1. For example, while the secure device is shown in FIG. 1 as a smartcard 106, any other secure devices could be used in the system 100. Also, while shown separately in FIG. 1, the host 102 and the smartcard reader 104 could be incorporated into a single functional unit. In addition, the system 100 could include any number of hosts 102, smartcard readers 104, and smartcards 106.

Figure 2:
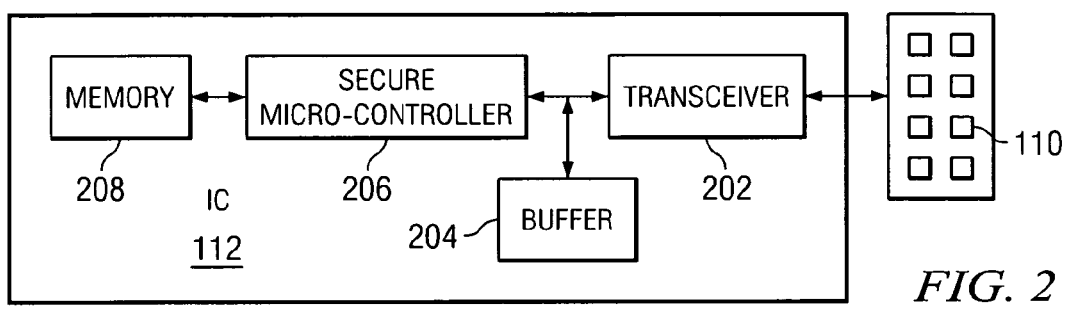
FIG. 2 illustrates an example secure device according to one embodiment of this disclosure.

FIG. 2 illustrates an example secure device according to one embodiment of this disclosure. In particular, FIG. 2 illustrates the smartcard 106 of FIG. 1. The embodiment of the smartcard 106 shown in FIG. 2 is for illustration only. Other embodiments of the smartcard 106 may be used without departing from the scope of this disclosure. Also, for ease of explanation, the smartcard 106 is described as operating within the system 100 of FIG. 1. The smartcard 106 could be used in any other suitable system.

As shown in FIG. 2, the integrated circuit 112 includes a transceiver 202 capable of communicating through the contacts 110. For example, the transceiver 202 may transmit information to and receive information from the host 102 via the contacts 110 and the smartcard reader 104. The transceiver 202 includes any suitable transmitter and/or receiver for communicating with a host.

The transceiver 202 is coupled to a buffer 204. The buffer 204 is capable of temporarily storing information received from or being transmitted to a host through the transceiver 202. The buffer 204 represents any suitable quantity and type of memory capable of storing and facilitating retrieval of information.

Figure 3:
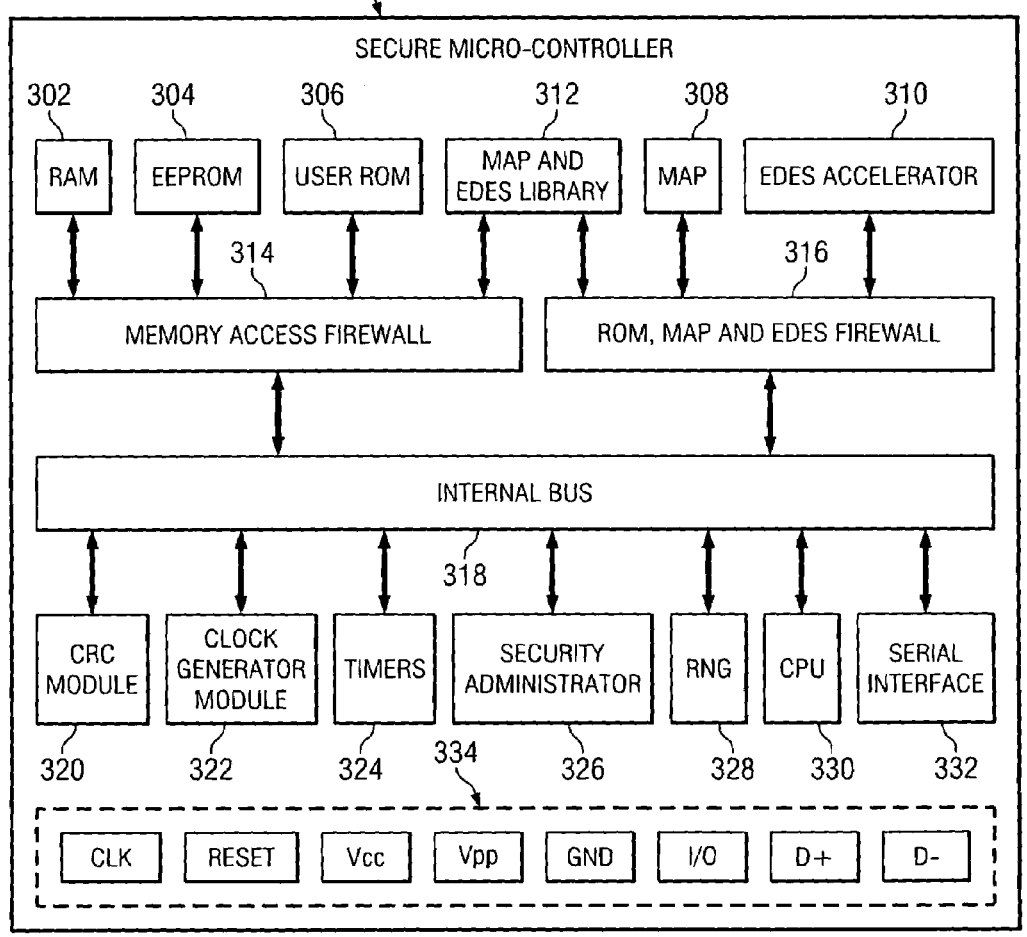
FIG. 3 illustrates an example secure microcontroller in a secure device according to one embodiment of this disclosure.

A secure microcontroller 206 is coupled to the transceiver 202 and the buffer 204. The secure microcontroller 206 is capable of communicating with the host 102 through the transceiver 202. The secure microcontroller 206 is also capable of performing various smartcard operations to secure information stored on the smartcard 106. For example, the secure microcontroller 206 could communicate with the host 102 to exchange and verify unique identifiers of the smartcard 106 and the host 102. The secure microcontroller 206 could also exchange different messages or types of messages with the host 102. As an example, a set of default messages could be sent between the secure microcontroller 206 and the host 102, where each default message has one or more associated alternate messages. The secure microcontroller 206 and the host 102 could switch between the default and alternate messages to make it more difficult to identify how the smartcard 106 operates. The secure microcontroller 206 includes any hardware, software, firmware, or combination thereof for securing information stored on the smartcard 106. The secure microcontroller 206 could, for example, represent an ST19WK08 smartcard controller from STMICROELECTRONICS, INC. One example embodiment of the secure microcontroller 206 is shown in FIG. 3, which is described below. Also, logic in the secure microcontroller 206 may be used as described above to detect glitches in clock signals used by the secure microcontroller 206 and identify possible fault injection or other attacks.

A memory 208 is coupled to the secure microcontroller 206. The memory 208 is capable of storing information being secured by the smartcard 106. The memory 208 could store any suitable information, such as information identifying a computer user, information needed to receive cable or satellite television services, or bank, credit, or debit card information. The memory 208 may store any other or additional information, such as the default and alternate messages and a secure key seed used for secure communications with the host 102. The memory 208 represents any suitable type and quantity of memory capable of storing and facilitating retrieval of information. The memory 208 could, for example, represent a quantity of non-volatile memory and a quantity of volatile memory.

Although FIG. 2 illustrates one example of a secure device, various changes may be made to FIG. 2. For example, the transceiver 202 could be coupled to an antenna for wireless communication instead of or in addition to being coupled to the contacts 110. Also, various components of FIG. 2 could be omitted, combined, or further subdivided and additional components could be added according to particular needs. In addition, the components shown in FIG. 2 could reside in any secure device and are not limited to use in a smartcard.

FIG. 3 illustrates an example secure microcontroller 206 in a secure device according to one embodiment of this disclosure. The embodiment of the secure microcontroller 206 shown in FIG. 3 is for illustration only. Other embodiments of the secure microcontroller 206 may be used without departing from the scope of this disclosure. Also, for ease of explanation, the secure microcontroller 206 is described as operating in the secure device of FIG. 2 within the system 100 of FIG. 1. The secure microcontroller 206 could be used in any other suitable device and in any other suitable system.

The secure microcontroller 206 includes various memories that store data and instructions used by the secure microcontroller 206. In this example, the secure microcontroller 206 includes a read only memory (RAM) 302, an electrically erasable programmable read only memory (EEPROM) 304, and a read only memory (ROM) 306. The EEPROM 304 and the ROM 306 could store instructions to be executed by the secure microcontroller 206, and the RAM 302 could store data used during execution of the instructions. The memories 302-306 represent any suitable memory or memories for storing and facilitating retrieval of information. Also, any number, quantity, and type of memory or memories could be used in the secure microcontroller 206, such as a four-kilobyte RAM 302, an eight-kilobyte EEPROM 304, and 112-kilobyte ROM 306.

The secure microcontroller 206 also includes a modular arithmetic processor (MAP) 308 and an Enhanced Data Encryption Standard (EDES) accelerator 310. The modular arithmetic processor 308 and the EDES accelerator 310 are used to speed up cryptographic calculations used by Public Key algorithms and Secret Key algorithms. The modular arithmetic processor 308 performs various functions to provide security for the smartcard 106. For example, the modular arithmetic processor 308 could execute asymmetrical algorithms that involve modular multiplication, squaring, and additional calculations. The operands processed by the modular arithmetic processor 308 could represent any suitable operands, such as operands having up to 2,176 bits. The modular arithmetic processor 308 includes any hardware, software, firmware, or combination thereof for implementing asymmetrical algorithms, such as a processor having a 1,088-bit architecture.

The EDES accelerator 310 also performs various functions to provide security for the smartcard 106. For example, the EDES accelerator 310 could execute symmetrical algorithms that include Data Encryption Standard (DES) calculations and triple DES calculations. The EDES accelerator 310 includes any hardware, software, firmware, or combination thereof for implementing symmetrical algorithms.

A library 312 stores information used by various components of the secure microcontroller 206. For example, the library 312 could store cryptographic software libraries used by the modular arithmetic processor 308 and the EDES accelerator 310. The library 312 could represent any suitable memory or memories for storing one or more libraries of information used by the modular arithmetic processor 308, the EDES accelerator 310, or other components, such as a ROM.

Two firewalls 314-316 protect access to the memories 302-306, the modular arithmetic processor 308, the EDES accelerator 310, and the library 312. For example, the firewalls 314-316 may use user-defined access rules stored on the ROM 306 to determine when access to the memories 302-306, the modular arithmetic processor 308, the EDES accelerator 310, and the library 312 is allowed. Each of the firewalls 314-316 represents any suitable hardware, software, firmware, or combination thereof for controlling access to a memory or other component of the secure microcontroller 206.

A bus 318 transports information between various components of the secure microcontroller 206. The bus 318 represents any suitable structure for transporting information, such as an eight-bit bus.

A Cyclic Redundant Check (CRC) module 320 allows verification of the data transmitted from and received at the secure microcontroller 206. For example, the CRC module 320 could generate CRC data for inclusion with data being transmitted by the secure microcontroller 206 to the host 102. The CRC module 320 could also use the CRC data included with data received by the secure microcontroller 206 from the host 102 to verify whether the data was received properly. The CRC module 320 includes any hardware, software, firmware, or combination thereof for performing CRC functions. The CRC module 320 could, for example, support the ISO 3309 standard.

A clock generator module 322 generates one or more clock signals for use by other components of the secure microcontroller 206. Clock signals at any suitable frequency or frequencies may be used in the secure microcontroller 206. The clock generator module 322 represents any structure capable of generating one or more clock signals at one or more frequencies.

One or more timers 324 provide timing functions for various components of the secure microcontroller 206. For example, each timer 324 could be capable of generating an interrupt when a specified amount of time elapses. Each timer 324 represents any suitable hardware, software, firmware, or combination thereof having timing capabilities. As an example, the secure microcontroller 206 could include two eight-bit timers 324.

A security administrator 326 monitors accesses to the secure microcontroller 206 and detects security violations. The security administrator 326 may then take any suitable action, such as generating interrupts or resetting the secure microcontroller 206. The security administrator 326 includes any hardware, software, firmware, or combination thereof for monitoring and controlling security for the secure microcontroller 206.

A random number generator (RNG) 328 generates values for use by other components of the secure microcontroller 206. In some embodiments, the random number generator 328 includes two generators of unpredictable number (GUN) registers compliant with Federal Information Processing Standard (FIPS) 140-2. The random number generator 328 includes any hardware, software, firmware, or combination thereof for generating random or pseudo-random numbers.

A central processing unit (CPU) 330 performs any of a wide variety of functions in the secure microcontroller 206. For example, the central processing unit 330 may execute instructions stored on the ROM 306 to provide desired functionality. The central processing unit 330 represents any suitable processor or combination of processors, such as an eight-bit processor having an extended addressing mode.

A serial interface 332 allows the secure microcontroller 206 to communicate with the smartcard reader 104 through a serial interface (such as through the contact 110 denoted I/O). The serial interface 332 includes any hardware, software, firmware, or combination thereof for supporting communication over a serial link. The serial interface 332 could support any suitable serial protocol(s) or standard(s), such as the ISO 7816 standard.

In addition, the secure microcontroller 206 includes various pins 334. The pins 334 represent connections that may be coupled to or otherwise electrically connected to corresponding contacts 110. The pins 334 represent any suitable structures for providing electrical connection between the secure microcontroller 206 and the contacts 110. In other embodiments, the pins 334 could provide connections to other or additional components, such as an antenna or an internal power supply.

In one aspect of operation, various components of the secure microcontroller 206 shown in FIG. 3 use clock signals generated by the clock generator module 322 and distributed through a clock tree. These components could, for example, include the modular arithmetic processor 308, the EDES accelerator 310, the CRC module 320, the timers 324, the security administrator 326, the central processing unit 330, and the serial interface 332. In some embodiments, each of these components could include registers (such as latches or D flip-flops) that are clocked by the clock signals distributed through the clock tree. As a result, glitches in the clock signals could cause one or more of these components to behave improperly, negatively affecting the security provided by the secure microcontroller 206. In some embodiments, circuits or other logic may be used in any of these or other components of the secure microcontroller 206 to identify glitches in the clock signals. An example embodiment of these circuits is shown in FIG. 4, which is described below.

Although FIG. 3 illustrates one example of a secure microcontroller 206 in a secure device, various changes may be made to FIG. 3. For example, various components of FIG. 3 could be omitted, combined, or further subdivided and additional components could be added according to particular needs.

Figure 4:
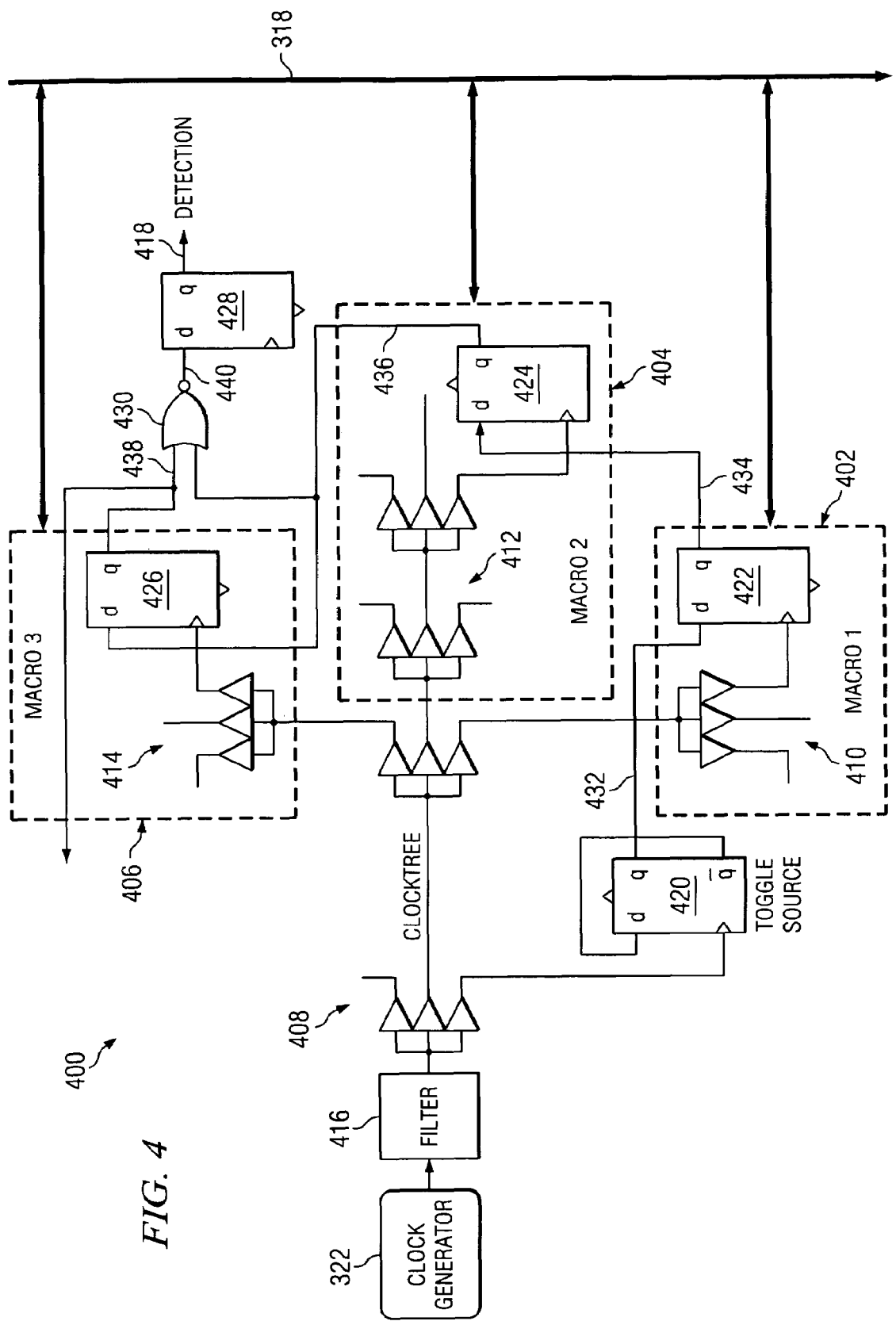
FIG. 4 illustrates an example circuit for glitch detection in a secure microcontroller according to one embodiment of this disclosure.

FIG. 4 illustrates an example circuit 400 for glitch detection in a secure microcontroller according to one embodiment of this disclosure. The embodiment of the circuit 400 shown in FIG. 4 is for illustration only. Other embodiments of the circuit 400 could be used without departing from the scope of this disclosure. Also, for ease of explanation, the circuit 400 is described as being used in the secure microcontroller 206 of FIG. 3 within the secure device of FIG. 2. The circuit 400 could be used in any other suitable device.

As shown in FIG. 4, the circuit 400 includes three macrocells 402-406. In general, a macrocell represents logic (such as registers and combinatorial logic) that implements one or more functions of a smartcard or other secure device. In this example, the macrocells 402-406 represent various components of the secure microcontroller 206 shown in FIG. 3. For example, the macrocells 402-406 could represent any of the modular arithmetic processor 308, the EDES accelerator 310, the CRC module 320, the timers 324, the security administrator 326, the central processing unit 330, and the serial interface 332. While shown in FIG. 4 as including three macrocells 402-406, any suitable number of macrocells could be used in or associated with the circuit 400.

The circuit 400 also includes a clock tree 408. The clock tree 408 distributes a clock signal from the clock generator module 322 to the macrocells 402-406 and other components in the secure microcontroller 206. For example, the clock tree 408 could include various buffers or drivers that split the clock signal into multiple copies. As shown in FIG. 4, the clock tree 408 includes three local branches 410-414. The local branches 410-414 are located in the macrocells 402-406 and further divide the clock signal for use by other logic within those macrocells 402-406. The clock tree 408 includes any suitable structure for providing copies of a clock signal to multiple components.

A filter 416 is located between the clock generator module 322 and the clock tree 408. The filter 416 removes glitches from the clock signal generated by the clock generator module 322 before the clock signal reaches the clock tree 408. This may help to reduce transitory effects in the clock signal and smooth the clock signal provided to the clock tree 408. The filter 416 includes any suitable filter for filtering a clock signal, such as a low-pass filter.

The remaining components in FIG. 4 represent logic used to detect glitches in the clock signals transported by the local branches 410-414. This logic, generally referred to as a "glitch detection circuit," is used to generate a glitch detection output signal 418. The glitch detection output signal 418 identifies if and when the glitch detection circuit detects a glitch in any of the clock signals transported by the local branches 410-414. For example, the glitch detection output signal 418 could have a low logic value when no glitches are detected and a high logic value when a glitch is detected.

In this example embodiment, the glitch detection circuit includes registers 420-428 and an XNOR gate 430. The register 420 represents a toggle source that generates a signal 432, which repeatedly toggles between high and low logic values. In this example, the register 420 has its inverted output (denoted "not Q") coupled to its input. The register 420 is clocked by a portion of the clock tree 408 outside of the local branches 410-414 (outside of the macrocells 402-406). Any other suitable source could be used to provide a toggling signal 432 (whether or not the toggling is constantly uniform).

The signal 432 is then fed sequentially through the series of registers 422-426 in the macrocells 402-406. The signal 432 is provided to the register 422, which is located in the macrocell 402. The register 422 is clocked by a clock signal from the local branch 410 of the clock tree 408 and generates a signal 434. The signal 434 is provided to the register 424, which is located in the macrocell 404. The register 424 is clocked by a clock signal from the local branch 412 of the clock tree 408 and generates a signal 436. The signal 436 is provided to the register 426 located in the macrocell 406 and to the XNOR gate 430. The register 426 is clocked by a clock signal from the local branch 414 of the clock tree 408 and generates a signal 438. The signal 438 is provided to the XNOR gate 430.

The XNOR gate 430 functions to determine when the signals 436-438 differ from one another and generates a corresponding output signal 440. In this example, when the signals 436-438 have a common logic value, the XNOR gate 430 outputs a high logic value as the output signal 440. When the signals 436-438 have different logic values, the XNOR gate 430 outputs a low logic value as the output signal 440. The output signal 440 is then sampled and latched by the register 428, which outputs the latched logic values as the glitch detection output signal 418. The register 428 could be clocked by any suitable source, such as one of the local branches 410-414 or another portion of the clock tree 408.

Figure 5A:
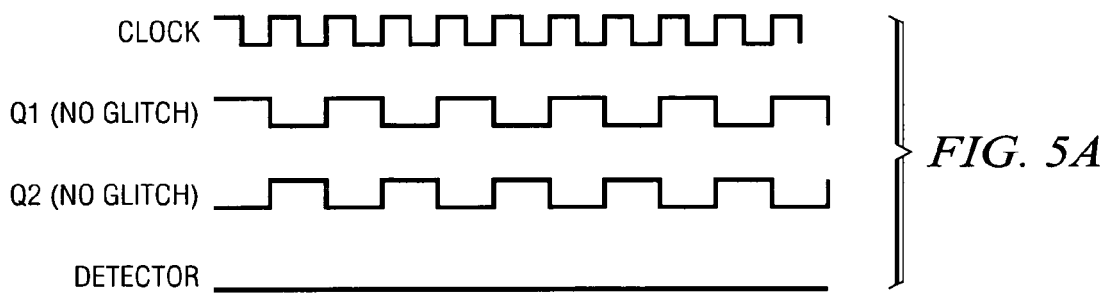
FIGS. 5A and 5B illustrate example timing diagrams for glitch detection in a secure microcontroller according to one embodiment of this disclosure.
Figure 5B:
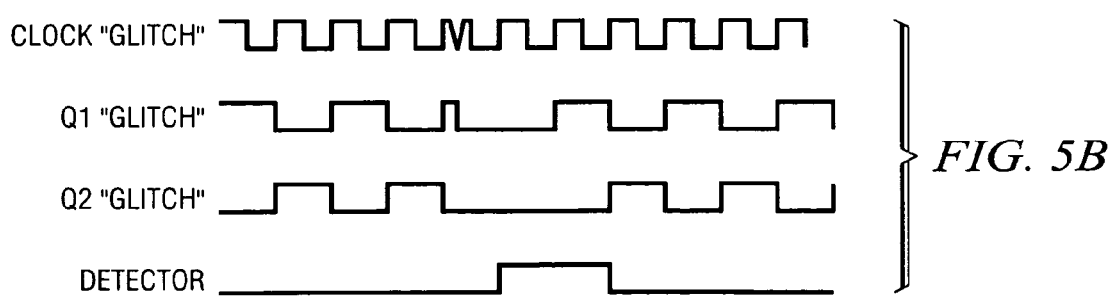

In one aspect of operation, the glitch detection circuit may operate as shown in FIGS. 5A and 5B. As shown in FIG. 5A, if no glitches occur in the clock signals, the signal 432 propagates through the registers 422-426 as signals 434-438. Because of the arrangement and clocking of the registers 422-426, the XNOR gate 430 receives two signals 436-438 (denoted Q1 and Q2 in FIG. 5A) that are completely out of phase with one another. Because the signals 436-438 are out of phase, the XNOR gate 430 constantly outputs a low logic value as the glitch detection output signal 418 (denoted "Detector" in FIG. 5A). In this case, the glitch detection circuit detects no glitches in the clock signals.

As shown in FIG. 5B, if a glitch does occur in the clock signals, the registers 422-426 generate signals 434-438. However, because of the arrangement and clocking of the registers 422-426, the XNOR gate 430 receives two signals 436-438 (denoted Q1 and Q2 in FIG. 5A) that are no longer completely out of phase with one another. Instead, for a period of time, both signals 436 - 438 have a common logic value. During that time, the XNOR gate 430 outputs a high logic value, which is latched by the register 428 at the next clock edge and output as the glitch detection output signal 418. In this case, the glitch detection circuit does detect a glitch in the clock signals. The high logic value in the glitch detection output signal 418 could then initiate any suitable action(s), such as logging of the event or resetting of the secure microcontroller 206.

It should be noted that FIG. 4 has illustrated the use of D flip-flops as registers and an XNOR gate. However, other logic capable of performing the same or similar functions could be used in the circuit 400. For example, any type of register could be used in FIG. 4. Also, while shown as comparing the outputs of the registers 424-426, the glitch detection circuit could compare the outputs of other or additional combinations of flip-flops. As an example, the glitch detection circuit could compare the outputs of the registers 422 and 426 to ensure that the outputs are always in phase, such as by using an XOR gate. A glitch could then be detected using the output of the XNOR gate and the output of the XOR gate, such as by sending those outputs through an OR gate.

In addition, FIG. 4 illustrates the generation of a single glitch detection output signal 418 using the XNOR gate 430 and the register 428. In other embodiments, the same or similar technique could be used to generate multiple glitch detection output signals 418. This may be useful, for example, when the glitch would otherwise propagate through a large number of registers. As an example, if a glitch propagates through twenty registers in twenty macrocells, an XNOR gate and a register could be used after every three or four registers in the twenty registers. This would allow the glitch to be detected more quickly.

Although FIG. 4 illustrates one example of a circuit 400 for glitch detection in a secure microcontroller, various changes may be made to FIG. 4. Similarly, while FIGS. 5A and 5B have illustrated example timings for glitch detection in a secure microcontroller 206, various changes may be made to FIGS. 5A and 5B. For example, the toggling signal 432 could be propagated through registers or other logic in any suitable number of macrocells. Also, FIGS. 5A and 5B illustrate specific examples of how the circuit 400 of FIG. 4 could operate. The circuit 400 could operate in any other or additional manner depending on the specific circumstances.

FIG. 6 illustrates an example method 600 for glitch detection in a secure microcontroller according to one embodiment of this disclosure. For ease of explanation, the method 600 is described with respect to the circuit 400 of FIG. 4 operating in the secure microcontroller 206 of FIG. 3. The method 600 could be used with any other suitable circuits and in any other suitable device.

The secure microcontroller 206 is operated normally in the smartcard 106 or other secure device at step 602. This may include, for example, components within the secure microcontroller 206 executing instructions and otherwise performing operations to provide security for information stored on the smartcard 106.

As part of this operation, the secure microcontroller 206 transports clock signals through various branches of a clock tree at step 604. This may include, for example, the clock generator module 322 generating a clock signal and the filter 416 filtering the clock signal. This may also include the clock tree 408 splitting the clock signal into multiple copies, both within local branches 410-414 of the clock tree 408 and in other portions of the clock tree 408.

The secure microcontroller 206 uses the clock signals to trigger the latching of a toggling or other signal at step 606. This may include, for example, using the clock signals from the local branches 410-414 to trigger the registers 422-426. The registers 422-426 then latch the signals 432-436, respectively, and generate the signals 434-438, respectively.

The secure microcontroller 206 compares at least some of the latched signals at step 608. This may include, for example, providing the signals 436-438 to the XNOR gate 420. The secure microcontroller 206 determines if the compared signals are indicative of a glitch occurring at step 610. This may include, for example, the XNOR gate 420 determining if the latched signals 436-438 have a common logic value (which is indicative of a glitch) or different logic values (which is indicative of no glitch).

If a glitch is detected, the secure microcontroller 206 identifies the glitch in the clock signals at step 612. This may include, for example, the XNOR gate 420 outputting a high logic value as the glitch detection output signal 418 if a glitch is detected. In other embodiments, the glitch detection output signal 418 could have a low logic value if a glitch is detected, such as when the XNOR gate 420 is replaced by an XOR gate.

Although FIG. 6 illustrates one example of a method 600 for glitch detection in a secure microcontroller, various changes may be made to FIG. 6. For example, although shown as a series of steps in FIG. 6, various steps in FIG. 6 may occur in parallel or at the same time.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, or software, or a combination of at least two of the same. It should be noted that the functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus, comprising:
a plurality of macrocells comprising logic capable of performing one or more functions;
a clock tree comprising a local branch within each macrocell, each local branch capable of receiving a first clock signal and providing at least one second clock signal to the corresponding macrocell; and
at least one glitch detection circuit capable of detecting a glitch in one or more of the second clock signals.

2. The apparatus of claim 1, wherein the at least one glitch detection circuit comprises:
a toggle source capable of providing a toggling signal; and
a plurality of registers, a first register capable of receiving and latching the toggling signal, each additional register capable of receiving and latching an output signal from a prior register.

3. The apparatus of claim 2, wherein:
each macrocell includes one or more of the registers; and
each macrocell is capable of clocking the one or more registers in the macrocell using the second clock signal provided by the local branch in the macrocell.

4. The apparatus of claim 3, wherein the at least one glitch detection circuit further comprises:
circuitry capable of comparing the latched signals from two or more of the registers to identify the glitch.

5. The apparatus of claim 4, wherein:
the plurality of registers comprises a plurality of D flip-flops; and
the circuitry capable of comparing the latched signals comprises an XNOR gate.

6. The apparatus of claim 5, wherein the XNOR gate is capable of receiving the latched signals from the D flip-flops in a last two of the macrocells.

7. The apparatus of claim 1, wherein the macrocells comprise components of a smartcard.

8. The apparatus of claim 7, wherein the macrocells comprise two or more different macrocells each selected from the group consisting of:
a modular arithmetic processor capable of executing asymmetrical cryptographic algorithms;
an encryption accelerator capable of executing symmetrical cryptographic algorithms;
a Cyclic Redundant Check module;
a timer;
a security administrator capable of detecting security violations;
a central processing unit; and
a serial interface.

9. The apparatus of claim 1, further comprising:
a clock generator capable of generating a clock signal; and
a filter capable of filtering the generated clock signal and providing the filtered clock signal to the clock tree as the first clock signal.

10. A secure device, comprising:
a memory capable of storing information; and
a secure microcontroller capable of securing the information in the memory, the secure microcontroller comprising:
a plurality of macrocells comprising logic capable of performing one or more functions;
a clock tree comprising a local branch within each macrocell, each local branch capable of receiving a first clock signal and providing at least one second clock signal to the corresponding macrocell; and
at least one glitch detection circuit capable of detecting a glitch in one or more of the second clock signals.

11. The secure device of claim 10, wherein the at least one glitch detection circuit comprises:
a toggle source capable of providing a toggling signal; and a plurality of registers, a first register capable of receiving and latching the toggling signal, each additional register capable of receiving and latching an output signal from a prior register.

12. The secure device of claim 11, wherein:
    each macrocell includes one or more of the registers; and
    each macrocell is capable of clocking the one or more registers in the macrocell using the second clock signal provided by the local branch in the macrocell.

13. The secure device of claim 12, wherein the at least one glitch detection circuit further comprises:
    circuitry capable of comparing the latched signals from two or more of the registers to identify the glitch.

14. The secure device of claim 13, wherein:
    the plurality of registers comprises a plurality of D flip-flops; and
    the circuitry capable of comparing the latched signals comprises an XNOR gate.

15. The secure device of claim 14, wherein the XNOR gate is capable of receiving the latched signals from the D flip-flops in a last two of the macrocells.

16. A method, comprising:
    operating, in a secure device, a plurality of macrocells comprising logic capable of performing one or more functions, each macrocell receiving at least one clock signal from a local branch of a clock tree within the corresponding macrocell; and
    during operation of the macrocells, detecting a glitch in one or more of the clock signals.

17. The method of claim 16, wherein detecting the glitch comprises:
    generating a toggling signal; and
    latching the toggling signal in a plurality of registers, a first register capable of receiving and latching the toggling signal, each additional register capable of receiving and latching an output signal from a prior register.

18. The method of claim 17, wherein each macrocell includes one or more of the registers, the method further comprising clocking the one or more registers in the macrocell using the clock signal provided by the local branch in the macrocell.

19. The method of claim 18, wherein detecting the glitch further comprises:
    comparing the latched signals from two or more of the registers to identify the glitch.

20. The method of claim 19, wherein the plurality of registers comprises a plurality of D flip-flops, the method further comprising:
    comparing the latched signals comprises providing the latched signals from the D flip-flops in a last two of the macrocells to an XNOR gate; and
    latching an output of the XNOR gate, the latched output of the XNOR gate indicative of whether the glitch has been detected.

* * * * *